United States Patent
Moore et al.

(10) Patent No.: US 12,142,660 B2
(45) Date of Patent: Nov. 12, 2024

(54) INSULATED TRENCH GATES WITH MULTIPLE LAYERS FOR IMPROVED PERFORMANCE OF SEMICONDUCTOR DEVICES

(71) Applicant: Pakal Technologies, Inc., San Francisco, CA (US)

(72) Inventors: Paul M. Moore, Fremont, CA (US); Richard A. Blanchard, Los Altos, CA (US)

(73) Assignee: Pakal Technologies, Inc., San Francisco, CA (US)

( * ) Notice: Subject to any disclaimer, the term of this patent is extended or adjusted under 35 U.S.C. 154(b) by 193 days.

(21) Appl. No.: 17/388,502

(22) Filed: Jul. 29, 2021

(65) Prior Publication Data
US 2022/0045189 A1  Feb. 10, 2022

Related U.S. Application Data

(60) Provisional application No. 63/060,967, filed on Aug. 4, 2020.

(51) Int. Cl.
| | |
|---|---|
| *H01L 29/49* | (2006.01) |
| *H01L 29/06* | (2006.01) |
| *H01L 29/423* | (2006.01) |
| *H01L 29/78* | (2006.01) |

(52) U.S. Cl.
CPC ...... *H01L 29/4916* (2013.01); *H01L 29/0696* (2013.01); *H01L 29/4236* (2013.01); *H01L 29/4238* (2013.01); *H01L 29/7801* (2013.01)

(58) Field of Classification Search
CPC ......... H01L 29/42336; H01L 29/42352; H01L 29/42356; H01L 29/4236; H01L 29/4916; H01L 29/0696; H01L 29/4238; H01L 29/7801; H01L 29/7813; H01L 29/7825; H01L 29/66734
See application file for complete search history.

(56) References Cited

U.S. PATENT DOCUMENTS

| | | | | |
|---|---|---|---|---|
| 2002/0179950 A1* | 12/2002 | Hijzen | ................ | H01L 29/7811 |
| | | | | 257/E21.384 |
| 2008/0035990 A1* | 2/2008 | Matsuura | ............ | H01L 29/7811 |
| | | | | 257/E21.409 |
| 2010/0252882 A1* | 10/2010 | Denison | .............. | H01L 29/0865 |
| | | | | 257/337 |
| 2020/0105748 A1* | 4/2020 | Chen | ................ | H01L 29/42364 |

* cited by examiner

*Primary Examiner* — Tucker J Wright
(74) *Attorney, Agent, or Firm* — Patent Law Group; Brian Ogonowsky

(57) ABSTRACT

Trenches having a gate oxide layer are formed in the surface of a silicon wafer for vertical gates. Conductive doped polysilicon is then deposited in the trenches to form a relatively thin layer of doped polysilicon along the sidewalls. Thus, there is a central cavity surrounded by polysilicon. Next, the cavity is filled in with a much higher conductivity material, such as aluminum, copper, a metal silicide, or other conductor to greatly reduce the overall resistivity of the trenched gates. The thin polysilicon forms an excellent barrier to protect the gate oxide from diffusion from the inner conductor atoms. The inner conductor and the polysilicon conduct the gate voltage in parallel to lower the resistance of the gates, which increases the switching speed of the device. In another embodiment, a metal silicide is used as the first layer, and a metal fills the cavity.

5 Claims, 3 Drawing Sheets

INSULATED TRENCH GATES WITH MULTIPLE LAYERS FOR IMPROVED PERFORMANCE OF SEMICONDUCTOR DEVICES

CROSS-REFERENCE TO RELATED APPLICATIONS

This application is based on provisional application Ser. No. 63/060,967, filed Aug. 4, 2020, by Paul M. Moore et al., assigned to the present assignee and incorporated herein by reference.

FIELD OF THE INVENTION

This invention relates to insulated trench gate power devices, such as vertical and lateral MOSFETs, vertical and lateral insulated gate bipolar transistors (IGBTs), vertical and lateral insulated gate turn-off (IGTO) devices, and other types of semiconductor devices that are generally used to switch high current/high voltage loads and, in particular, to trenched gate material combinations that improve efficiency and increase switching speed in such devices.

BACKGROUND

Applicant's U.S. Pat. No. 8,878,238, incorporated by reference, discloses a vertical power device which will be used as an example of one of many types of power devices that can benefit from the present invention. The power device from U.S. Pat. No. 8,878,238 will be described in detail, and the invention will later be described as a modification to such a device, and other insulated trench gate power devices, rather than repeating a detailed description of the prior art portion of the inventive structure.

Prior art FIG. 1 is a cross-sectional view of a small portion of a vertical power device 10 described in U.S. Pat. No. 8,878,238 that can benefit from the present invention. Although FIG. 1 just shows an edge portion of the cellular power device 10, the invention applies to all areas within the cellular array.

Three cells are shown having vertical gates 143, consisting of doped polysilicon, formed in insulated trenches 141A. Trench 141B is for a polysilicon connection to all the gates 143 and may not be considered a cell. A 2-dimensional array of the cells, forming, for example, strips or a rectangular mesh, may be formed in a common, lightly-doped p-well 107 (acting as a p-base), and the cells are connected in parallel.

Trenched gates are used because they take up very little silicon real estate, and vertical devices can typically have a breakdown voltage that is higher than a lateral device (gates on top).

N+ regions 129 surround some or all of the gates 143 and are contacted by a top, metal cathode electrode 127 having a cathode terminal 101. The n+ regions 129 may be formed by implantation or by other known dopant introduction methods.

The vertical gates 143 are insulated from the p-well 107 by an oxide layer 145. The gates 143 are connected together outside the plane of the drawing and are coupled to a gate voltage via a metal gate electrode 109 (which may be a gate pad coupled to a lead of the die) directly contacting the polysilicon in the trench 141B. A patterned dielectric layer 119 insulates the gate electrode 109 from the p-well 107 and insulates the gates 143 from the cathode electrode 127.

Guard rings 113 near the edge of the die reduce field crowding for increasing the breakdown voltage. The guard rings 113 are contacted by metal 161 and 163, which are insulated from the n− drift layer 106 by field oxide 117.

A vertical npnp semiconductor layered structure is formed. There is a bipolar pnp transistor formed by a p+ substrate 104, an epitaxially grown n− drift layer 106 (acting as an n− base), and the p− well 107. There is also a bipolar npn transistor formed by the n+ regions 129, the p-well 107, and the n− drift layer 106. An n-type buffer layer 105, with a dopant concentration higher than that of the n− drift layer 106, reduces the injection of holes into the n− drift layer 106 from the p+ substrate 104 when the device is conducting. A bottom anode electrode 103 contacts the substrate 104, and the top cathode electrode 127 contacts the n+ regions 129 and also contacts the p-well 107 at selected locations. The p-well 107 surrounds the gate structure, and the n− drift layer 106 extends to the surface around the p-well 107.

When the anode electrode 103 is forward biased with respect to the cathode electrode 127, but without a sufficiently positive gate bias, there is no current flow, since there is a reverse biased vertical pn junction and the product of the betas (gains) of the pnp and npn transistors is less than one (i.e., there is no regeneration activity).

When the gate 143 is sufficiently biased with a positive voltage (relative to the n+regions 129), such as 2-5 volts, an inversion layer is formed around the gate 143, and electrons from the n+ regions 129 become the majority carriers along the gate sidewalls and below the bottom of the trenches in the inversion layer, causing the effective width of the npn base (the portion of the p-well 107 between the n-layers) to be reduced. As a result, the beta of the npn transistor increases to cause the product of the betas to exceed one. This condition results in "breakover," when holes are injected into the lightly doped n− drift layer 106 and electrons are injected into the p-well 107 to fully turn on the device. Accordingly, the gate bias initiates the turn-on, and the full turn-on (due to regenerative action) occurs when there is current flow through the npn transistor as well as current flow through the pnp transistor.

When the gate bias is taken to zero, such as the gate electrode 109 being shorted to the cathode electrode 127, or taken negative, the power device 10 turns off, since the effective base width of the npn transistor is increased to its original width.

The device 10 is intended to be used as a high voltage/high current switch with very low voltage drop when on. The maximum voltage for proper operation is specified in a data sheet for the device 10.

The device 10 is similar to many other types of trenched, high current/high voltage insulated-gate power switches in that it is cellular, the trenches are filled with doped polysilicon, and all the gates are connected together to a single driver. Polysilicon has excellent properties for fabricating a semiconductor device, since it is inexpensive, it is easy to deposit, and it is easy to grow oxide over the polysilicon for insulating the top of the gate from a metal source (or cathode) electrode. Further, the polysilicon does not significantly interact with the thin gate oxide after it is deposited.

One issue with using doped polysilicon to fill the insulated trenches is that the resistivity of doped polysilicon is much higher than other conductors, such as Al, Cu, and conductive silicides (e.g., TSi2 and WSi2). The resistivity of such polysilicon is 5×10E-4 to 1×10E-2 ohm-meter, where the resistivity depends on the doping concentration and the particulars of the fabrication process. Polysilicon is formed by Chemical Vapor Deposition (CVD) and may be doped during or after the CVD process.

The final resistivity of the polysilicon affects the speed at which the power device switches on and off, where a higher resistivity slows the switching. Further, since the trenched gates are connected together by the doped polysilicon, a higher resistivity polysilicon will cause different resistances between the gate electrode pad and gates closest to the gate electrode and between the gate electrode pad and gates farther from the gate electrode pad. This difference may cause different heating patterns across the die and possibly thermal runaway, resulting from different current densities across the die.

What is needed is a design and fabrication technique that reduces the resistivity of the gate material in insulated trenches yet still achieves the various benefits of doped polysilicon.

SUMMARY

The inventive technique improves the performance of all trenched gate devices, whether used as an on/off switch or an analog device. The technique can be used with both vertical and lateral devices.

In one embodiment, trenches are formed in the surface of a silicon wafer using masking and RIE (reactive ion etching). The trenches are exposed to heat in an oxygen atmosphere to form a thin gate oxide layer over the surface of the trenches. Doped polysilicon is then deposited in the trenches to form a relatively thin layer of doped polysilicon along the sidewalls (including the bottom surface). Typically, the doping material is arsenic and/or phosphorus, though boron may be used. The polysilicon bonds to and builds up from the trench surfaces. It is acceptable if the polysilicon deposition is not uniform over the gate oxide. Thus, there is a cavity extending within the polysilicon.

Next, the cavity in the polysilicon is filled in with a much higher conductivity material, such as aluminum, copper, alloys thereof, a metal silicide, or other conductor to greatly reduce the resistivity of the trenched gates. The thin polysilicon forms an excellent barrier to protect the gate oxide from diffusion from the inner conductor atoms. The inner conductor and the polysilicon conduct the gate voltage in parallel to lower the resistance of the gates. This lower resistance increases the switching speed of the trench gate device and reduces heating.

In another embodiment, the cavity in the doped poly silicon is coated with a silicide (having a resistivity lower than the doped polysilicon), where the silicide bonds with the polysilicon and expands from the sides of the cavity. Next, the cavity in the silicide is filled with a more highly conductive metal, such as aluminum or copper or an alloy. All three materials then conduct the gate voltage. Etch steps remove excess material from the surface of the silicon wafer.

In another embodiment, instead of using doped polysilicon as the layer directly abutting the gate oxide, a silicide forms the inner layer. The silicide is formed to have a cavity that is filled with a metal or other high-conductivity material. The silicide acts as a barrier against diffusion of the metal atoms into the gate oxide.

In another embodiment, the insulated trenches are partially filled with the doped polysilicon, so that there is no middle cavity. The top portion of the polysilicon is etched away, so that the polysilicon only abuts the inner vertical channel section of the gate and not the top source regions. The top of the gate inside the trench is then filled with a much higher conductivity material, such as a metal (e.g., Al or Cu) or a silicide. In this way, the higher conductivity material does not interact with the gate oxide along the channel so the effective gate oxide width stays the same. The higher conductivity material reduces the overall resistance of the gates between the gate pad and the channel.

In another embodiment, the doped polysilicon is formed to extend above the trench and is covered on the top and exposed sides by a highly conductive silicide layer or metal layer so there is very good electrical contact to the polysilicon (compared to contacting only the small top surface of the polysilicon).

In another embodiment, the gate material, such as doped polysilicon, extends above the trench. A metal conductor is then formed to contact the top surface of the gate material. This greatly reduces the resistance between the gate pad and all the trenched gates so all gates have equally conductive paths to the gate pad. Oxide sidewall spacers are then formed along the exposed sides of the gate material and the gate contact metal. Assuming the body region is p-type, n-type dopants are then implanted into the surface (to form n+ source contact regions) and precisely spaced from the trench by the sidewall spacers acting as a mask. Thus, the n+ source regions are self-aligned with the trench by the spacers. In this way, the n+ source contact shape, position, and depth can be more precisely controlled, allowing for very shallow n-type source regions abutting the trench.

The above-described approaches work with all types of trenched, insulated-gate devices. The device power electrodes may be on opposite sides of the die (vertical) or on the same side of the die (lateral).

Other embodiments are disclosed.

BRIEF DESCRIPTION OF THE DRAWINGS

Elements that are the same or equivalent in the various figures may be labeled with the same numeral.

DETAILED DESCRIPTION

Figure 1:
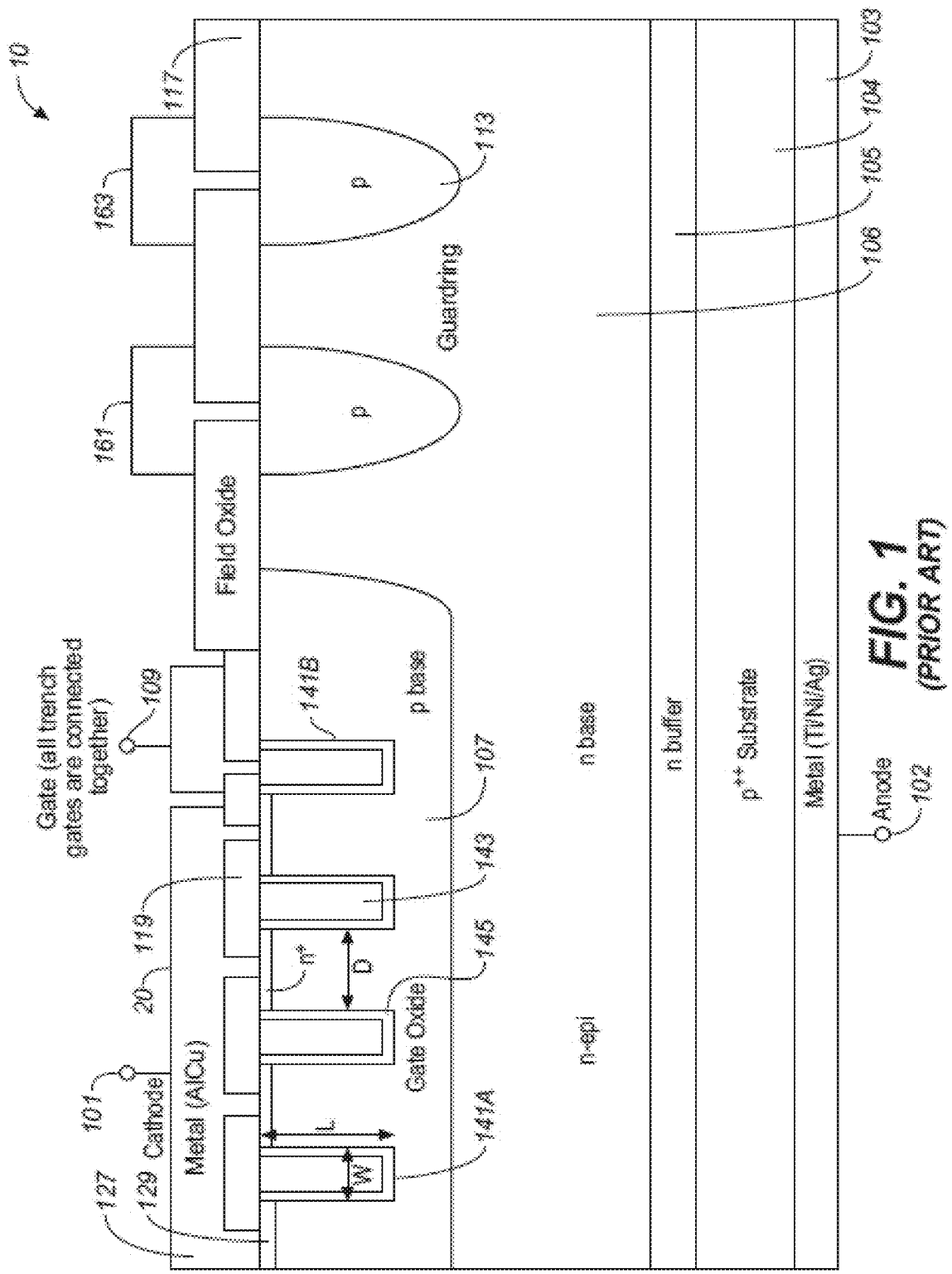
FIG. 1 is copied from Applicant's U.S. Pat. No. 8,878,238 and is a cross-section of a vertical switch having an insulated trench gates connected in parallel.
Figure 2:
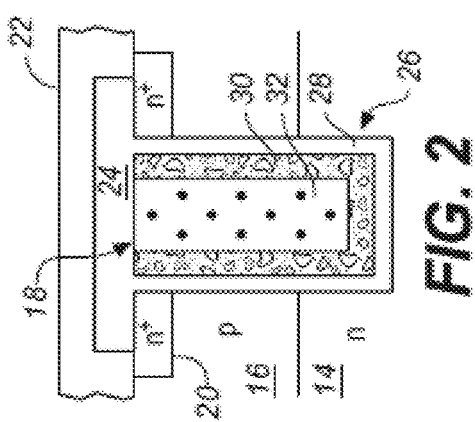
FIG. 2 is a cross-section of an insulated trench gate, in accordance with one embodiment of the invention, in any vertical or lateral semiconductor device, such as the power device of FIG. 1, an IGBT, a MOSFET, a thyristor, etc., where the overall conductivity of the gate is lower compared to a doped polysilicon gate by using two different gate materials.

FIG. 2 is a cross-section of an insulated trench gate in a silicon wafer, in accordance with one embodiment of the invention, in any vertical or lateral semiconductor device, such as the power device of FIG. 1, an IGBT, a MOSFET, a thyristor, etc.

An n-type drain layer 14 can also be the n− drift layer 106 in FIG. 1 or any suitable layer in a vertical or lateral gate-controlled device. Above the drain layer 14 is a p− layer 16 that forms a channel region abutting the insulated trench gate 18. Above the p-layer 16 are n+ source regions 20 that are connected to a metal source (or cathode) electrode 22. An oxide layer 24 insulates the gate 18 from the electrode 22. The anode electrode (not shown) may be on the bottom or top of the die.

A trench 26 is etched through the various layers using a mask and RIE.

The resulting wafer is then heated in an oxygen atmosphere to grow a thin gate oxide 28 on the walls of the trench 26.

A CVD process is then conducted to deposit doped polysilicon 30 over the gate oxide 28. The Si atoms in the doped polysilicon 30 deposit on the gate oxide 28, and the polysilicon grows outward. After a thin layer of polysilicon is grown, the CVD process is stopped so that there is a middle cavity in the polysilicon 30.

A metal silicide 32, such as WSi2, or other conductive silicide, is then deposited in the cavity, such as by CVD. The silicide 32 is more conductive than the doped polysilicon 30, but the polysilicon 30 provides a good barrier against diffusion of the metal atoms into the gate oxide 28. Diffusion of metal atoms into the gate oxide 28 would change the threshold voltage and possibly cause the gate oxide 28 to be conductive.

Any excess gate material is etched away during an etching step for that particular material.

The top of the resulting gate 18 is electrically connected to a metal gate pad outside of the cross-section. The electrical connection between any gate and the gate pad may be via the distributed polysilicon and silicide gate materials forming the array of gates. Thus, gates closest to the gate pad and gates farthest from the gate pad will both have a very low resistance path to the gate pad. Lowering the overall gate resistance is important for all regions of the array of gates to be at substantially the same voltage.

In the example of FIG. 2, biasing the gate 18 sufficiently positive with respect to the source regions 20 (i.e., exceeding a threshold voltage), inverts the p-layer 16 abutting the trench 26 to cause a conductive channel to form between the source regions 20 and the drain layer 14, assuming the source electrode 22 is positively biased with respect to the drain. A metal drain electrode (not shown) is formed on the bottom or top surface of the die, which may use an n+substrate. It is also known to use a p+ substrate to form an npnp layered structure.

The insulated trench gates may be part of a cellular structure, where each cell conducts substantially the same current, and the cells are connected in parallel.

Accordingly, the overall conductivity of the insulated trench gate is lower compared to a doped polysilicon gate by using two different gate materials, which improves efficiency, lowers threshold voltages, lowers die temperature, and improves switching speed.

Figure 3:
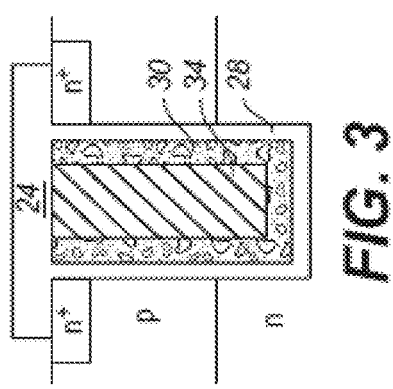
FIG. 3 illustrates another embodiment of an insulated trench gate, where two different gate materials are used in the insulated trench gate.

FIG. 3 is similar to FIG. 2 but a metal 34 (e.g., Al or Cu) or a metal alloy fills the cavity in the doped polysilicon 30 to further reduce gate resistivity.

Figure 4:
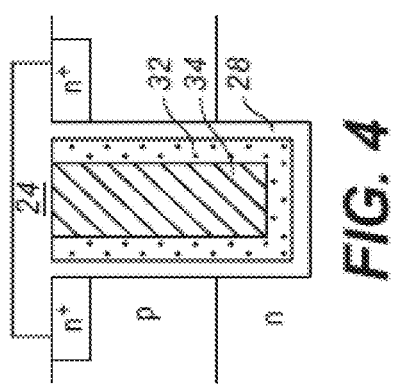
FIG. 4 illustrates another embodiment of an insulated trench gate, where two different gate materials are used in the insulated trench gate.

In FIG. 4, a high conductivity metal silicide 32 is used as the first layer in the insulated trench. If the metal atoms in the silicide diffuse slowly enough, they will not significantly diffuse into the gate oxide 28. A metal 34 (e.g., Al or Cu) then fills the cavity in the silicide 32 to lower the resistance of the overall gate. The silicide 32 acts as a barrier to metal diffusion from the metal 34.

Figure 5:
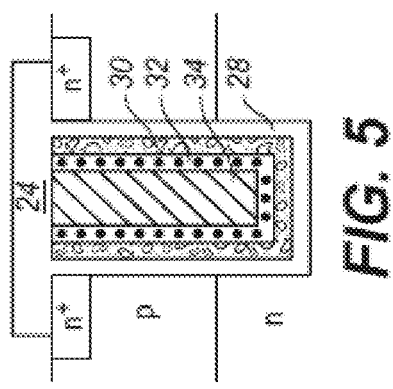
FIG. 5 illustrates another embodiment of an insulated trench gate, where three different gate materials are used in the insulated trench gate.

In FIG. 5, three different materials are used in the insulated trench gate. A doped polysilicon 30 layer is deposited, followed by a metal silicide 32 layer, followed by metal 34 filling in the cavity. The polysilicon 30 and silicide 32 act as barrier layers for the metal atoms.

Figure 6:
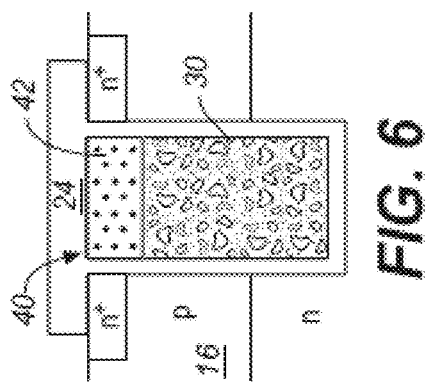
FIG. 6 illustrates another embodiment of an insulated trench gate, where the top of the insulated trench gate is a higher conductivity material.

FIG. 6 illustrates another embodiment of an insulated trench gate, where the top of the trenched gate 40 is formed of a higher conductivity material. In the example, the bottom part of the trench that forms the channel region is completely filled with doped polysilicon 30, and the top of the trench is filled with a higher conductivity material 42, such as metal silicide. This configuration lowers the connection resistance between the gate and the gate pad, yet the silicide does not affect the gate oxide 28 in the channel region (along the p-type layer 16). The trench may instead be filled with a combination of conductive materials, as described above.

Figure 7:
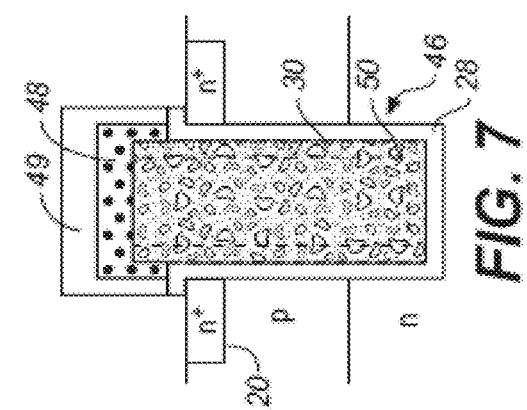
FIG. 7 illustrates another embodiment of an insulated trench gate, where the gate material extends above the trench, and the top and exposed sides of the gate material is contacted by a highly conductive material for a very low resistance contact to the gate material.

FIG. 7 illustrates another embodiment of an insulated trench gate, where the gate material, such as doped polysilicon 30 or any of the other gate materials discussed above, extends above the trench 46, and the top and exposed sides of the gate material is contacted by a highly conductive material, such as a metal silicide 48 or metal, for a very low resistance contact to the gate material. In a conventional insulated trench gate, there may be, at most, a direct connection to the top of the gate material in the trench, which is only a very small area. By also directly contacting the sides of the gate material extending above the trench, the contact area is greatly increased to reduce resistivity between the gate pad and the gate material. A dielectric 49 insulates the silicide 48, and a source electrode (not shown) contacts the tops of the n+ source regions 20.

The gate material in FIG. 7 may comprise layers of different conductive materials, as described with respect to FIGS. 2-6, where the layers of different conductive materials extend above the trench and are electrically contacted by a contact material that directly contacts top and side surfaces of the exposed materials. The dashed outline 50 in the gate material of FIG. 7 represents the option of two different conductive materials in the trench.

Figure 8:
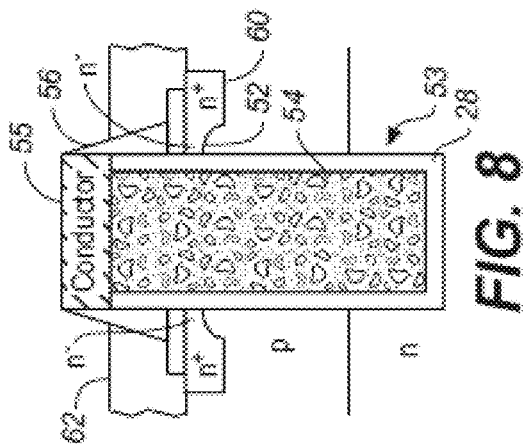
FIG. 8 illustrates another embodiment of an insulated trench gate, where oxide sidewall spacers are used to self-align and control the shape of the source contact region.

FIG. 8 illustrates another embodiment of an insulated trench gate. Prior to or after the trenches are formed, n-type source regions 52 are formed by masking and ion implantation adjacent to the insulated trench 53. Gate material 54, such as doped polysilicon, is deposited and etched to extend above the trench 53. A conductive material 55, such as a metal (e.g., Al or Cu, or alloys thereof), is formed over the top surface of the gate material 54. Oxide spacers 56 are then deposited and etched to form a mask for a deeper n-dopant implant with a higher concentration. Additional n-type dopants are then implanted and diffused. The oxide spacers 56 self-align the ion implantation to precisely control the shape of the n+ source contact region 60.

A source electrode 62 then contacts the n+ source contact region 60.

As with FIG. 7, the gate material in FIG. 8 may be any of the layered gate materials in FIGS. 2-7.

Figure 9:
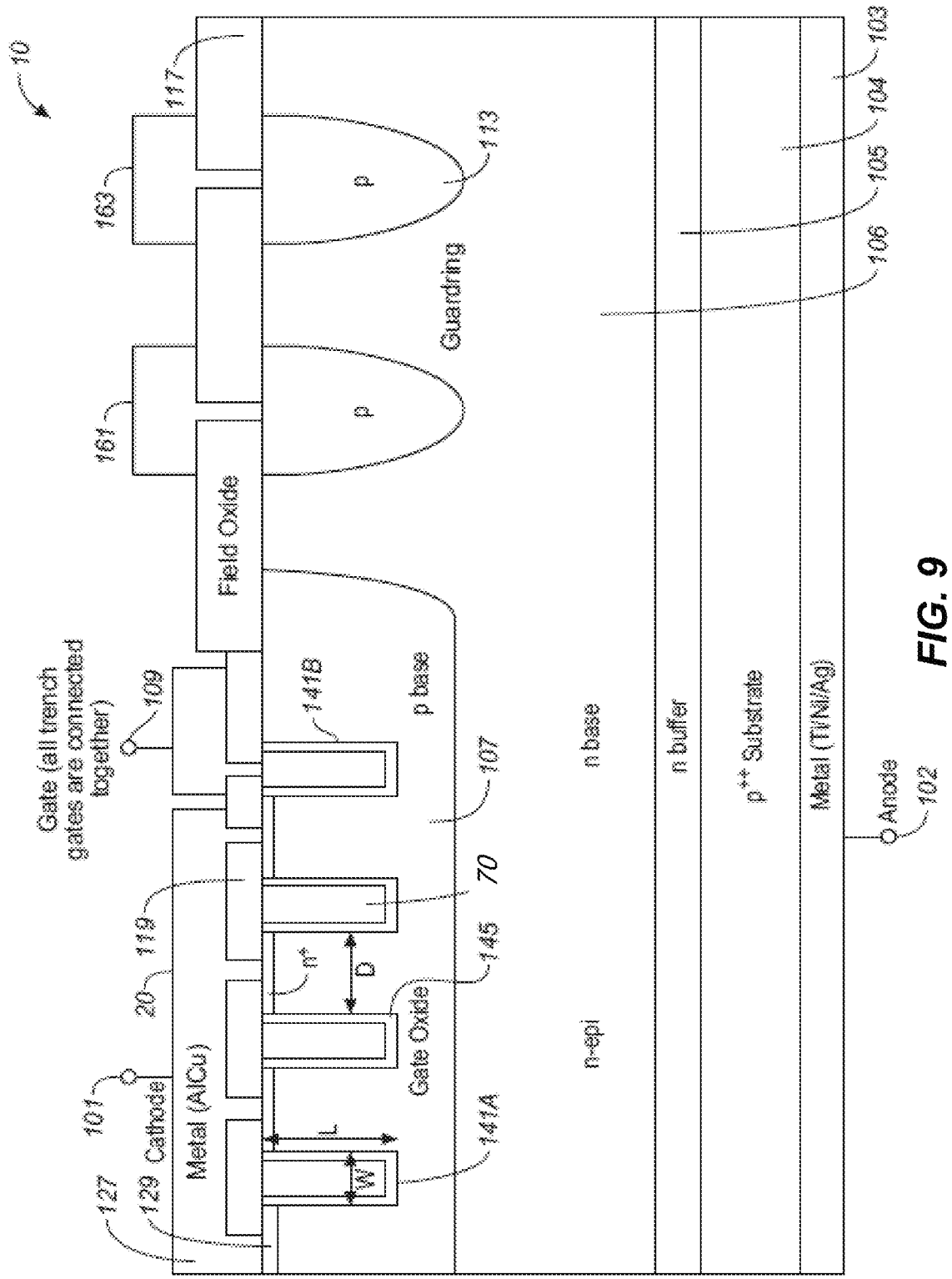
FIG. 9 illustrates the power device of FIG. 1 but includes any of the new gate structures described herein.

FIG. 9 illustrates the power device of FIG. 1 but includes any of the new gate structures, labeled as gate 70 in FIG. 9, described herein.

The concepts described above can be used to improve the performance of any insulated trench gate device, such as MOSFETs, IGTO devices, IGBTs, thyristors, etc.

Various features disclosed may be combined to achieve a desired result.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A semiconductor, insulated trench gate device comprising:
    a first semiconductor layer of a first conductivity type;
    a second semiconductor layer of a second conductivity type;
    a trench formed in at least the first semiconductor layer, the trench having sidewalls;
    an oxide layer on the sidewalls;
    a first conductive material in the trench abutting the oxide layer, wherein the first conductive material extends above the trench, wherein the first conductive material comprises doped polysilicon;
    a conductive gate contact material directly contacting an exposed top of the first conductive material, the conductive gate contact material comprising a metal;
    oxide sidewall spacers along exposed sides of at least the conductive gate contact material, wherein a top of the conductive gate contact material is level with a top of the oxide sidewall spacers; and
    doped source regions, the source regions comprising a first portion and a second portion,
    the first portion abutting the trench and having a first depth below a top surface of the first semiconductor layer,
    the second portion being self-aligned with the oxide sidewall spacers and being spaced away from the trench, the second portion having a second depth, greater than the first depth, below the top surface of the first semiconductor layer,
    wherein the device forms an npnp layered structure.

2. The device of claim 1 wherein the trench is within a cellular array of trenches.

3. A semiconductor, insulated trench gate device comprising:
    a first semiconductor layer of a first conductivity type;
    a second semiconductor layer of a second conductivity type;
    a trench formed in at least the first semiconductor layer, the trench having sidewalls;
    an oxide layer on the sidewalls;
    a first conductive material in the trench abutting the oxide layer, wherein the first conductive material extends above the trench, wherein the first conductive material comprises doped polysilicon;
    a conductive gate contact material directly contacting an exposed top of the first conductive material, the conductive gate contact material comprising a metal;
    oxide sidewall spacers along exposed sides of at least the conductive gate contact material, wherein a top of the conductive gate contact material is level with a top of the oxide sidewall spacers; and
    doped source regions, the source regions comprising a first portion and a second portion,
    the first portion abutting the trench and having a first depth below a top surface of the first semiconductor layer,
    the second portion being self-aligned with the oxide sidewall spacers and being spaced away from the trench, the second portion having a second depth, greater than the first depth, below the top surface of the first semiconductor layer,
    wherein the trench is within a cellular array of trenches.

4. The device of claim 3 wherein the device comprises a MOSFET.

5. The device of claim 3 wherein the device comprises an insulated-gate power device.

* * * * *